(12) United States Patent
Iwabuchi et al.

(10) Patent No.: US 8,823,061 B2
(45) Date of Patent: Sep. 2, 2014

(54) SEMICONDUCTOR DEVICE

(75) Inventors: Akio Iwabuchi, Niiza (JP); Hironori Aoki, Niiza (JP)

(73) Assignee: Sanken Electric Co., Ltd., Niiza-shi (JP)

( * ) Notice: Subject to any disclaimer, the term of this patent is extended or adjusted under 35 U.S.C. 154(b) by 377 days.

(21) Appl. No.: 13/210,950

(22) Filed: Aug. 16, 2011

(65) Prior Publication Data

US 2012/0043588 A1 Feb. 23, 2012

(30) Foreign Application Priority Data

Aug. 23, 2010 (JP) ................................ P2010-185780

(51) Int. Cl.
| | | |
|---|---|---|
| *H01L 29/66* | (2006.01) | |
| *H01L 29/778* | (2006.01) | |
| *H01L 29/423* | (2006.01) | |
| *H01L 29/10* | (2006.01) | |
| *H01L 29/20* | (2006.01) | |

(52) U.S. Cl.
CPC ...... *H01L 29/7787* (2013.01); *H01L 29/66462* (2013.01); *H01L 29/42316* (2013.01); *H01L 29/1029* (2013.01); *H01L 29/2003* (2013.01)
USPC ...................... 257/194; 257/12; 257/E29.246

(58) Field of Classification Search
CPC ............ H01L 29/1029; H01L 29/7787; H01L 29/66462; H01L 29/42316; H01L 29/2003; H01L 29/778
USPC ......... 257/183, 194, 192, 196, 12, 51, 85, 90, 257/94, 97, E29.246, E29.247, E29.252, 257/E21.403, E21.407
See application file for complete search history.

(56) References Cited

U.S. PATENT DOCUMENTS

| | | | |
|---|---|---|---|
| 2002/0017648 A1* | 2/2002 | Kasahara et al. ................ 257/79 |
| 2006/0043415 A1* | 3/2006 | Okamoto et al. ............. 257/192 |
| 2006/0060871 A1* | 3/2006 | Beach .............................. 257/94 |
| 2006/0175627 A1 | 8/2006 | Shiraishi |
| 2007/0102727 A1* | 5/2007 | Twynam ........................ 257/194 |
| 2010/0102359 A1* | 4/2010 | Khan et al. .................... 257/194 |

OTHER PUBLICATIONS

U.S. Appl. No. 13/204,968, filed Aug. 8, 2011, Aoki.
U.S. Appl. No. 13/251,563, filed Oct. 3, 2011, Iwabuchi, et al.
U.S. Appl. No. 13/298,705, filed Nov. 17, 2011, Aoki.

* cited by examiner

*Primary Examiner* — Cuong Q Nguyen
*Assistant Examiner* — Yosef Gebreyesus
(74) *Attorney, Agent, or Firm* — Oblon, Spivak, McClelland, Maier & Neustadt, L.L.P.

(57) ABSTRACT

A semiconductor device includes: a first semiconductor layer; a second semiconductor layer; a two-dimensional carrier gas layer; a source electrode; a drain electrode; a gate electrode; and an auxiliary electrode located above the two-dimensional carrier gas layer between the gate electrode and the drain electrode. Channel resistance of the two-dimensional carrier gas layer between the gate electrode and the auxiliary electrode is set higher than channel resistance of the two-dimensional carrier gas layer between the gate electrode and the source electrode.

6 Claims, 5 Drawing Sheets

SEMICONDUCTOR DEVICE

CROSS-REFERENCE TO RELATED APPLICATION

This application is based upon and claims the benefit of priority from Japanese Patent Application No. 2010-185780, filed Aug. 23, 2010; the entire contents of which are incorporated herein by reference.

BACKGROUND OF THE INVENTION

1. Field of the Invention

The present invention relates to a semiconductor device and, more specifically, relates to a semiconductor device including a high electron mobility transistor (HEMT).

2. Description of the Related Art

High electron mobility transistors (HEMTs) including gallium nitride (GaN) compound semiconductors have been conventionally known. The HEMTs have low resistance and high breakdown voltage and are used in power applications, for example.

US 2006/0175627A1 discloses a power supply system (a synchronous rectification circuit) capable of increasing the power conversion efficiency of a non-isolated DC/DC converter and therefore realizing a high power supply efficiency. In this conventional power supply system, a series circuit of a high side switch and a low side switch is provided between a DC power terminal and a ground terminal. The high side switch is composed of an HEMT having a lateral structure, and the low side switch is composed of a power MOSFET having a vertical structure. The switch elements of the series circuit are controlled by a driver IC to be alternately turned on and off. The power supply system then converts input power to a predetermined DC power. In the power supply system, use of an HEMT as the high side switch can reduce the switching loss and conduction loss.

SUMMARY OF THE INVENTION

However, the aforementioned conventional power supply system does not consider the following factors. In the conventional power supply system, if power supply to the DC power terminal and ground terminal fluctuates due to external noise or the like or if the driver IC malfunctions to simultaneously turn on the two switching elements, large current (through-current) flows between the DC power terminal and ground terminal. Moreover, when the load is short-circuited, large current flows through the switching elements. Such large current will damage, break down, or burns the HEMT used in the high side switch in particular. There is no disclosure of techniques concerning current limitation against overcurrent failure.

The present invention is made to solve the aforementioned problem. An object of the present invention is to provide a semiconductor device with the switching elements prevented from being damaged, broken, or burned by excess current due to external noise or the like.

In order to solve the aforementioned problem, a semiconductor device according to a first aspect of the present invention includes: a first semiconductor layer; a second semiconductor layer provided on the first semiconductor layer with a heterojunction interface interposed therebetween; a two-dimensional carrier gas layer provided near the heterojunction interface in the first semiconductor layer; a source electrode electrically connected to one end of the two-dimensional carrier gas layer; a drain electrode electrically connected to the other end of the two-dimensional carrier gas layer; a gate electrode provided above the two-dimensional carrier gas layer between the source electrode and the drain electrode; and an auxiliary electrode provided above the two-dimensional carrier gas layer between the gate electrode and the drain electrode. Channel resistance of the two-dimensional carrier gas layer between the gate electrode and the auxiliary electrode is set higher than channel resistance of the two-dimensional carrier gas layer between the gate electrode and the source electrode.

Preferably, the auxiliary electrode is supplied with a fixed potential, and the auxiliary electrode has a normally on structure in which a channel is generated in the two-dimensional carrier gas layer just under the auxiliary electrode.

Preferably, the auxiliary electrode is electrically connected to the source electrode.

Preferably, channel length of the two-dimensional carrier gas layer between the gate electrode and the auxiliary electrode is longer than channel length of the two-dimensional carrier gas layer between the gate electrode and the source electrode.

Preferably, sheet resistance of the two-dimensional carrier gas layer between the gate electrode and the auxiliary electrode is set higher than that between the gate electrode and the source electrode.

Preferably, the semiconductor device according to the first aspect of the present invention further includes a recess dug in the semiconductor layer from the surface of the semiconductor layer toward the heterojunction interface between the gate electrode and the drain electrode, and the auxiliary electrode is provided in the recess.

According to the first aspect of the present invention, it is possible to provide a semiconductor device with the switching elements prevented from being damaged, broken, or burned by excess current due to external noise or the like.

DETAILED DESCRIPTION OF THE EMBODIMENTS

Figure 1:
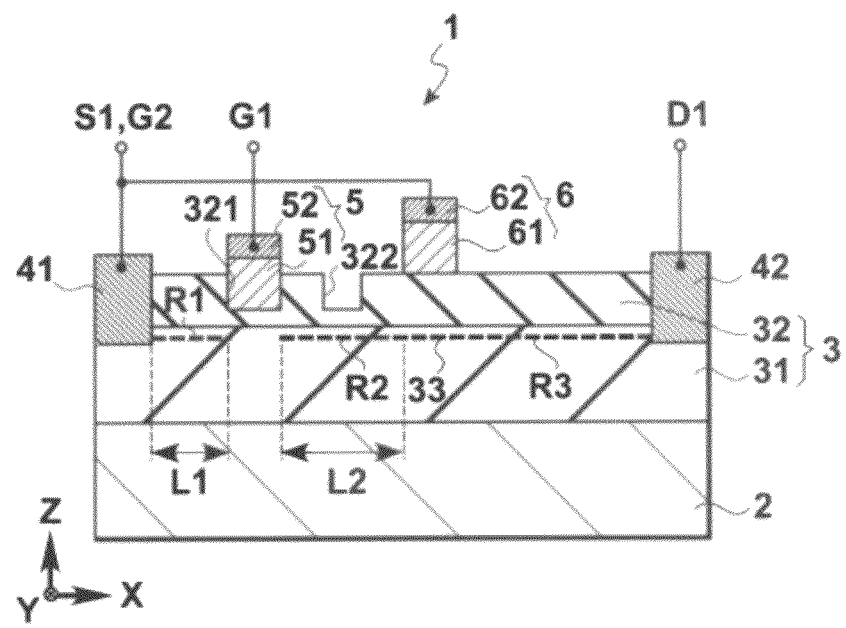
FIG. 1 is a main portion cross-sectional view schematically illustrating an HEMT of a semiconductor device according to Embodiment 1.

Next, embodiments of the present invention are described with reference to the drawings. In the following description of the drawings, same or similar portions are given same or similar reference numerals. It should be noted that the drawings are schematic and are different from the real ones. Some portions have different dimensional relations and proportions through the drawings.

The following embodiments show devices and methods to embody the technical idea of the present invention by example. The technical ideas of the present invention do not specify the arrangements and the like of the constituent components as described below. Moreover, the technical idea of the present invention can be variously changed within the scope of claims.

(Embodiment 1)

Figure 2:
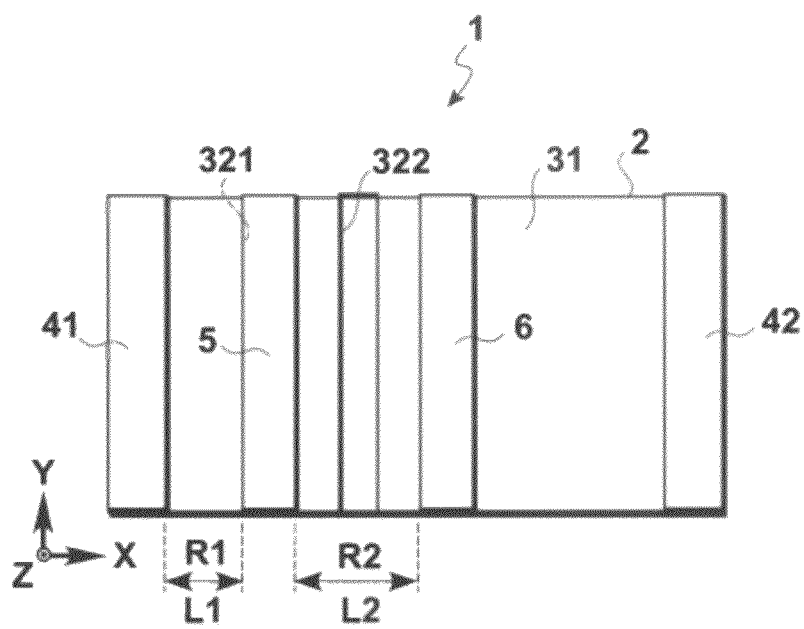
FIG. 2 is a schematic main portion planer view of the HEMT illustrated in FIG. 1.
Figure 3:
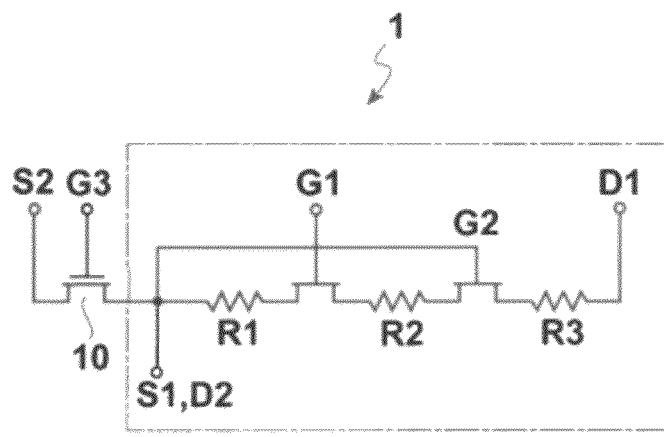
FIG. 3 is an equivalent circuit diagram of the HEMT of the semiconductor device according to Embodiment 1.

In Embodiment 1, a description is given of an example of an application of a semiconductor device including an HEMT as illustrated in FIGS. 1 to 3. The semiconductor device is incorporated in a power supply circuit system, for example.

[Equivalent Circuit Diagram of HEMT of Semiconductor Device]

As illustrated in FIG. 3, a semiconductor device 1 according to Embodiment 1 includes an HEMT. The HEMT includes a source electrode S1 as a first main electrode, a drain electrode D1 as a second main electrode, a gate electrode G1, and an auxiliary electrode G2. The source electrode S1 is electrically connected to one end of a channel region of the HEMT. The drain electrode D1 is electrically connected to the other end of the channel region of the HEMT. The gate electrode G1 is located above the channel region of the HEMT between the source electrode S1 and the drain electrode D1. The auxiliary electrode G2 is located above the channel region of the HEMT between the gate electrode G1 and the drain electrode D1.

The HEMT is incorporated as a high side switch of a power supply circuit system, for example, as a switching element having a lateral structure. The circuit structure thereof is not shown. A low side switch of the power supply circuit system is a power MISFET 10 as a switching element having a vertical structure, for example. The power MISFET 10 includes: a drain electrode D2 which is commonly used (electrically connected) as the source electrode S1 of the HEMT; a source electrode S2, and a gate electrode G3 located between the drain electrode D2 and the source electrode S2. In short, the HEMT of the semiconductor device 1 and the power MISFET 10 constitute a series circuit. Herein, the MISFET includes the meaning of an MOSFET. Moreover, in Embodiment 1, the power MISFET 10 is a semiconductor device packaged separately from the semiconductor device 1. However, the power MISFET 10 may be included in the same package as the semiconductor device 1.

If the semiconductor device 1 is used as the high side switch incorporated in the power supply circuit system, the drain electrode D1 of the HEMT is connected to the high level of the DC power supply (fixed power supply). The gate electrode G1 of the HEMT is connected to the driver IC of the synchronous rectification circuit, for example. The gate electrode G1 performs on/off control of the HEMT according to a control signal from the driver IC.

On the other hand, the source electrode S2 of the power MISFET 10 used as a low side switch is connected to the low level of a DC power supply (a fixed power supply, for example, a ground potential). The gate electrode G3 is connected to the driver IC of the synchronous rectification circuit, for example. The gate electrode G3 performs on/off control of the power MISFET 10 with a phase opposite to the on/off control of the HEMT according to the control signal from the driver IC.

The source electrode S1 of the HEMT and the drain electrode D2 of the power MISFET 10 are connected to a circuit next to the power circuit system via a parasitic inductor, an output capacitor, and the like through not-illustrated connection lines. The source electrode S1 and the drain electrode D2 output DC voltage obtained by converting the control signal (input voltage) from the driver IC to a predetermined level. In the HEMT of the semiconductor device 1 according to Embodiment 1, the auxiliary electrode G2 located between the gate electrode G1 and the drain electrode D1 is connected to a fixed potential. Herein, the auxiliary electrode G2 is electrically connected to the source electrode S1 and is supplied with a same fixed potential as the source electrode S1. The principal purpose of the auxiliary electrode G2 is not to reduce the electric field at an end of the gate electrode G1 of the HEMT on the drain electrode D1 side. As the principal purpose, the auxiliary electrode G2 has a function of preventing damage, breakdown, burning, and the like of the device induced when the HEMT and power MISFET 10 in the series circuit are simultaneously turned on by excess drain current due to some failure such as load short circuit or the like, for example. The HEMT particularly is more likely to be damaged or broken by excess drain current than the power MISFET 10. Accordingly, the auxiliary electrode G2 is provided at least for the HEMT.

As illustrated in FIG. 3, between the source electrode S1 and the gate electrode G1 of the HEMT, channel resistance R1 exists. Between the gate electrode G1 and the auxiliary electrode and G2, channel resistance R2 exists. Between the auxiliary electrode G2 and the drain electrode D1, channel resistance R3 exists.

[Device Structure of Semiconductor Device]

As illustrated in FIGS. 1 and 2, the HEMT of the semiconductor device 1 according to Embodiment 1 includes: a substrate 2; a first semiconductor layer 31 on the substrate 2; a second semiconductor layer 32 provided on the first semiconductor layer 31 with a heterojunction face interposed therebetween; a two-dimensional carrier gas layer 33 provided near the heterojunction interface of the second semiconductor layer 32; a source electrode (S1) 41 electrically connected to one end of the two-dimensional carrier gas layer 33; a drain electrode (D1) 42 electrically connected to the other end of the two-dimensional carrier gas layer 33; a gate electrode (G1) 5 provided between the source electrode 41 and the drain electrode 42 above the two-dimensional carrier gas layer 33; and an auxiliary electrode (G2) 6 provided between the gate electrode 5 and the drain electrode 42 above the two-dimensional carrier gas layer 33. The channel resistance R2 of the two-dimensional carrier gas layer 33 between the gate electrode 5 and the auxiliary electrode 6 is set higher than the channel resistance R1 of the two-dimensional carrier gas layer 33 between the gate electrode 5 and the source electrode 41. The HEMT of the semiconductor device 1 according to Embodiment 1 has an n-channel conductivity and is composed of a normally off structure.

In Embodiment 1, the substrate 2 is a silicon single-crystalline semiconductor substrate (Si substrate). The substrate 2 is not limited to this example and may be a sapphire substrate, a silicon carbide substrate (SiC substrate), a GaN substrate, or the like.

A buffer layer can be provided between the substrate 2 and the first semiconductor layer 31. The buffer layer has a function of relaxing the lattice mismatch between the substrate 2 and first semiconductor layer 31. The buffer layer is composed of a group III nitride semiconductor material. Typical group III nitride semiconductors are expressed by $Al_xIn_yGa_{1-x-y}N$ ($0<=x<=1, 0<=y<=1, 0<=x+y<=1$). In Embodiment 1, the buffer layer can be (but not limited to) a composite film including a plurality of GaN layers and a plurality of AlN layers alternately stacked on each other.

The first semiconductor layer 31 and the second semiconductor layer 32 constitute a semiconductor function layer 3 in which the HEMT is really mounted. The first semiconductor layer 31 of the semiconductor function layer 3 is composed of a nitride semiconductor layer, specifically, a GaN layer. The first semiconductor layer 31 functions as a carrier travel layer. In the HEMT of the semiconductor device 1 according to Embodiment 1, carriers are electrons, and the first semiconductor layer 31 functions as an electron travel layer. The second semiconductor layer 32 is composed of a nitride semiconductor layer. Specifically, the second semiconductor layer 32 is composed of an AlGaN layer having a lattice constant smaller than that of the semiconductor layer 31 and having a band gap larger than that of the first semiconductor layer 31. The second semiconductor layer 32 functions as a carrier supply layer. In Embodiment 1, the second semiconductor layer 32 functions as an electron supply layer.

The two-dimensional carrier gas layer 33 is a two-dimensional electron gas (2DEG) layer. The two-dimensional carrier gas layer 33 is extended from left to right in the direction X in FIG. 1. The two-dimensional carrier gas layer 33 functions as a channel region in which current (or electrons or holes) flows in the direction X or in the opposite direction thereto. A direction Y is a direction crossing the direction that the two-dimensional carrier gas layer 33 is extended in a plane parallel to the heterojunction interface (the direction X).

In Embodiment 1, the thickness of the first semiconductor layer 31 used in the semiconductor device 1 is set in a range of 0.5 to 10.0 µm, but not necessarily limited to these values. Herein, since the semiconductor layer 31 is a GaN layer, the thickness of the GaN layer is set to 5.0 to 6.0 µm, for example. The thickness of the AlGaN layer as the second semiconductor layer 32 is set in a range of 5.0 and 100.0 nm, for example and is set to 30 nm herein, for example.

The source electrode 41 forms an ohmic contact with one end of the two-dimensional carrier gas layer 33 to be electrically connected. The source electrode 41 is partially embedded in a trench dug from the surface of the second semiconductor layer 32 through the heterojunction interface at least to the two-dimensional carrier gas layer 33 of the first semiconductor layer 31. The electrode material of the source electrode 41 forming an ohmic contact can be a laminate film including a Ti layer and an Al layer laid thereon. Herein, the Ti layer has a thickness of 10 to 50 nm, and the Al layer has a thickness of 100 to 1000 nm, for example. As illustrated in FIG. 1, the cross-sectional shape of the source electrode 41 has a rectangular shape having a thickness dimension in the direction Z not so different from the width dimension in the direction X. As illustrated in FIG. 2, the planar shape of the source electrode 41 has a stripe shape having a length in the direction Y greater than the width dimension in the direction X. The source electrode 41 is not limited to the structure embedded in the trench and can be provided so as to be electrically connected to the two-dimensional carrier gas layer 33 on the surface of the second semiconductor layer 32.

The drain electrode 42 forms an ohmic contact with the other end of the two-dimensional carrier gas layer 33 to be electrically connected thereto. Similar to the source electrode 41, the drain electrode 42 is partially embedded in a trench dug from the surface of the second semiconductor layer 32 through the heterojunction interface to reach at least the two-dimensional carrier gas layer 33 of the first semiconductor layer 31. The electrode material of the drain electrode 42 is the same as that of the source electrode 41 herein. The cross-sectional shape and planer shape of the drain electrode 42 is the same as those of the source electrode 41 herein. The drain electrode 42 is not limited to the structure partially embedded in the trench and can be located so as to be electrically connected to the two-dimensional carrier gas layer 33 on the surface of the second semiconductor layer 32.

The gate electrode 5 is located between the source electrode 41 and the drain electrode 42 above the two-dimensional carrier gas layer 33. The gate electrode 5 forms a Schottky contact with the surface of the second semiconductor layer 32. The gate electrode 5 is (but not limited to) located on the bottom surface of a recess (or a hollow) 321 dug in the second semiconductor layer 32 from the surface of the second semiconductor layer 32 in the depth direction. If the thickness of the second semiconductor layer 32 is set to 30 nm, the depth of the recess 321 is set to 23 to 27 nm and preferably to 25 nm, for example.

The gate electrode 5 is made of an electrode material capable of forming a Schottky barrier. The gate electrode 5 is herein made of a composite film of a Schottky electrode layer 51 and a metallic layer 52 laid on the Schottky electrode layer 51. The Schottky electrode layer 51 can be composed of any one of a p-type semiconductor layer, a metal oxide layer of NiO or the like, a Co layer, an Fe layer, a Ga layer doped with Mg, and an AlGaN layer doped with Mg, for example. The metal layer 52 can be an Au layer, for example. The HEMT composed using such a structure and materials has a normally off characteristic, and the threshold voltage Vth of the HEMT is set to 1 V, for example.

The auxiliary electrode 6 is located between the gate electrode 5 and the drain electrode 42 above the two-dimensional carrier gas layer 33. The auxiliary electrode 6 forms a Schottky contact with the surface of the second semiconductor layer 32. In Embodiment 1, similar to the gate electrode 5, the auxiliary electrode 6 is made of an electrode material capable of forming a Schottky barrier and is herein made of a composite film including a Schottky electrode layer 61 and a metallic layer 62 laid on the Schottky electrode layer 61. The Schottky electrode layer 61 is made of the same material as that of the Schottky electrode layer 51 of the gate electrode 5. The metallic layer 62 is made of the same material as that of the metallic layer 51 of the gate electrode 5. The auxiliary electrode 6 is electrically connected to the source electrode 41 to be supplied with a fixed potential. The two-dimensional carrier gas layer 33 is generated just under the auxiliary electrode 6, and the auxiliary electrode 6 has a normally on characteristic.

The HEMT of the semiconductor device 1 according to Embodiment 1 includes a recess (or a hollow) 322 located between the gate electrode 5 and the auxiliary electrode 6. The recess 322 is dug in the second semiconductor layer 32 from the surface thereof in the depth direction. As illustrated in FIG. 2, the recess 322 has a stripe shape having a length dimension in the direction Y greater than the width dimension in the direction X similar to the planer shapes of the source electrode 41, drain electrode 42, gate electrode 5, and auxiliary electrode 6. The recess 322 is located so as to cross all of the two-dimensional carrier gas layer 33 in a direction crossing (herein, perpendicular to) the direction that current flows in the two-dimensional carrier gas layer 33. By providing the recess 322, the second semiconductor layer 32 is made partially thin. The recess 322 therefore has a function of reducing the supply of carriers from the second semiconductor layer 32 to the two-dimensional carrier gas layer 33 to increase the resistance of the two-dimensional carrier gas layer 33 just under the recess 322, that is, the channel resistance R2.

The cannel resistance R2 of the two-dimensional carrier gas layer 33 is proportional to the channel length L2 of the two-dimensional carrier gas layer 33 between the gate electrode 5 and the auxiliary electrode 6. The longer the channel length L2, the higher the channel resistance R2. In the two-dimensional carrier gas layer 33 having a constant width (a constant channel width, a constant cross-sectional area) in the direction Y in the HEMT, the channel resistance R2 is higher than the channel resistance R1 of the two-dimensional carrier gas layer 33 between the source electrode 41 and the gate electrode 5 if the channel length L2 of the two-dimensional carrier gas layer 33 is longer than the channel length L1 of the two-dimensional carrier gas layer 33 between the source electrode 41 and the gate electrode 5. In the HEMT of the semiconductor device 1 according to Embodiment 1, the recess 322 is located between the gate electrode 5 and the auxiliary electrode 6 to set the sheet resistance of the two-dimensional carrier gas layer 33 corresponding to the channel length L2 higher than that corresponding to the channel length L1. By such a structure, the channel resistance R2 is set higher while the device area in the direction X is reduced. In Embodiment 1, the channel length L1 (but not limited to) is set to 2.0 to 2.1 μm, and the channel length L2 is set to 2.4 to 2.6 μm, for example.

The manufacturing process of the semiconductor device 1 is not particularly described. In Embodiment 1, the recess 322 is formed by the same manufacturing process as the process to form the recess 321 in which the gate electrode 5 is to be located. If the recess 322 is formed by the same manufacturing process as the process to form the recess 321 (using the process to form the recess 321 instead), a particular process to form the recess 322 is not necessary although the pattern of the manufacturing mask is changed. The number of manufacturing processes can be therefore reduced.

[Operation Mechanism of Semiconductor Device]

The semiconductor device 1 according to Embodiment 1 illustrated in FIGS. 1 to 3 includes the following operation mechanism. By load short circuit or the like, excess current flows between the source electrode (S1) 41 and the drain electrode (D1) 42 in the HEMT. In the HEMT, the channel resistance R2 of the two-dimensional carrier gas layer 33 is set higher by increasing the channel length L2 or providing the recess 322. The potential of the two-dimensional carrier gas layer 33 just under the auxiliary electrode (G2) 6 is therefore increased. If the potential just under the auxiliary electrode 6 exceeds threshold voltage (Vthz) of the part including the auxiliary electrode 6, pinch off occurs to cause current limitation.

Figure 4:
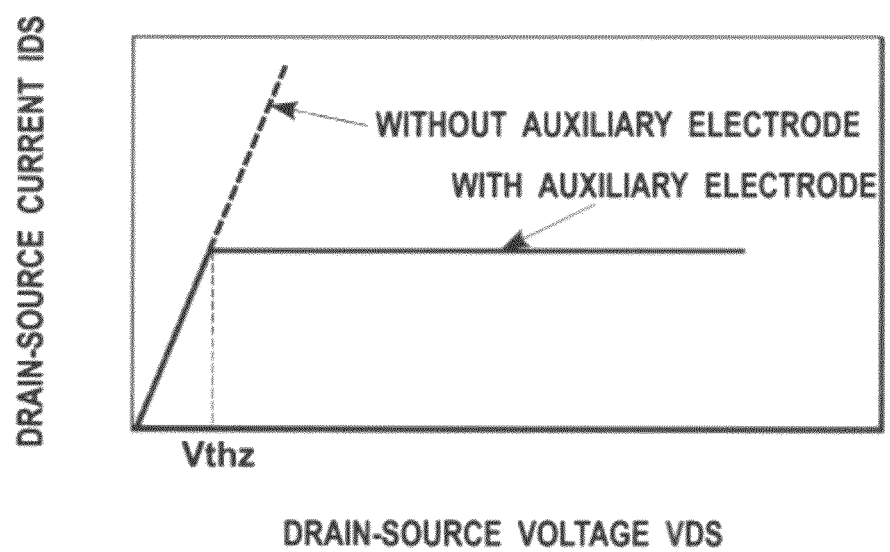
FIG. 4 is a current-voltage characteristic diagram of the HEMT illustrated in FIG. 1.

FIG. 4 illustrates a current-voltage characteristic of the HEMT of the semiconductor device 1 according to Embodiment 1. In FIG. 4, the vertical axis indicates drain-source current, and the horizontal axis indicates drain-source voltage. When the auxiliary electrode 6 and channel resistance R2 are not provided, in the HEMT, the drain-source current increases as the drain-source voltage increases until the device is damaged, broken, or burned. On the other hand, when the auxiliary electrode 6 and channel resistance R2 are provided, in the HEMT, the drain-source current increases until the drain-source voltage increases to the threshold voltage Vthz of the part corresponding to the auxiliary electrode 6. However, if the drain-source voltage exceeds the threshold voltage Vthz, pinch off occurs to cause current limitation. The drain-source current therefore does not increase. In the HEMT of the semiconductor device 1 according to Embodiment 1, excess current exceeding current corresponding to the threshold voltage Vthz does not flow between the drain electrode and the source electrode. Thus the device is not damaged, broken, or burned.

[Characteristics of Semiconductor Device]

As described above, according to the semiconductor device 1 according to Embodiment 1, it is possible to prevent the HEMT from being damaged, broken, or burned by excess current due to external noise or the like.

[Modification 1]

As for the semiconductor device 1 according to Modification 1 of Embodiment 1, a description is given of an example which is the same as the semiconductor device 1 illustrated in FIGS. 1 and 2 except that the HEMT includes a plurality of recesses 322 between the gate electrode (G1) 5 and auxiliary electrode (G2), each recess 322 having a planer shape and a cross-sectional shape different from those of the semiconductor device 1 illustrated in FIGS. 1 and 2.

Figure 5:
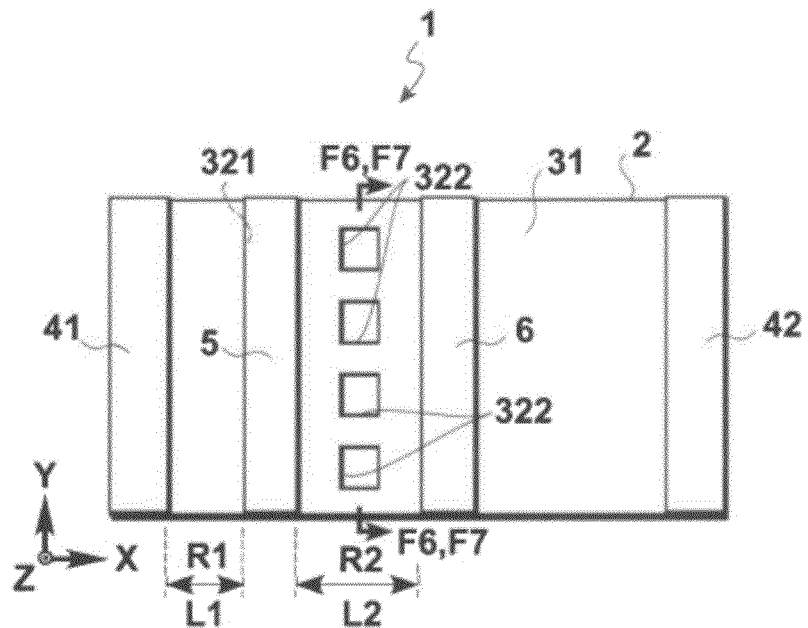
FIG. 5 is a main portion cross-sectional view schematically illustrating an HEMT of a semiconductor device according to Modification 1 of Embodiment 1.

As illustrated in FIG. 5, in the semiconductor device 1 according to Modification 1 of Embodiment 1, the planer shape of each recess 322 is a rectangular shape having a dimension in the direction X equal to or a little different from a dimension in the direction Y. The plurality of recesses 322 are arranged in a line in the direction Y. The recesses 322 may be arranged not only in a line but also in two lines in the direction Y. Alternatively, the recesses 322 may be arranged in a zigzag in the direction Y. In the semiconductor device 1 according to Embodiment 1, the recess 322 has a stripe planer shape. In the semiconductor device 1 according to Modification 1, each of the recesses 322 has a dot shape.

Figure 6:
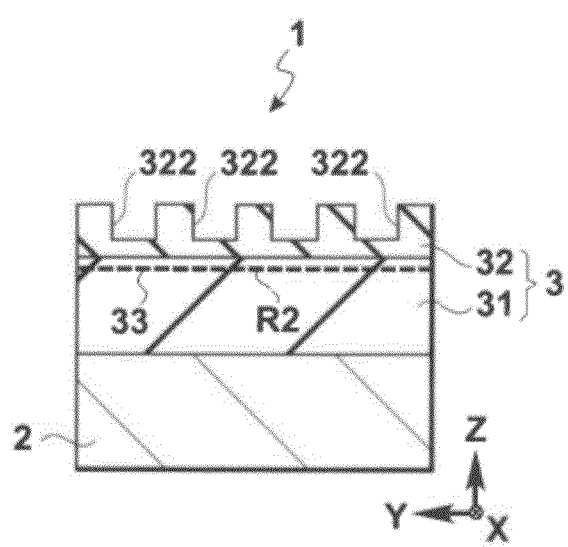
FIG. 6 is a main portion cross-sectional view of the HEMT illustrated in FIG. 5.

As illustrated in FIG. 6 (a cross-sectional view taken along a line F6-F6 in FIG. 5), the cross-sectional shape of each recess 322 has a rectangular shape dug from the surface of the second semiconductor layer 32 into the second semiconductor layer 32 similar to the recess 322 of the semiconductor device 1 according to Embodiment 1. The value of the channel resistance R2 of the two-dimensional carrier gas layer 33 is adjusted by controlling at least one of the depth of the recesses 322, the number of the recesses 322, the planer size of the recesses 322, and the intervals of the recesses 322. The device area of the HEMT can be reduced if the channel resistance R2 is increased.

[Modification 2]

As for the semiconductor device 1 according to Modification 2 of Embodiment 1, a description is given of an example which is the same as of the semiconductor device 1 illustrated in FIGS. 5 and 6 except the cross-sectional shape of each recess 322 between the gate electrode (G1) 5 and the auxiliary electrode (G2) 6 in the HEMT.

Figure 7:
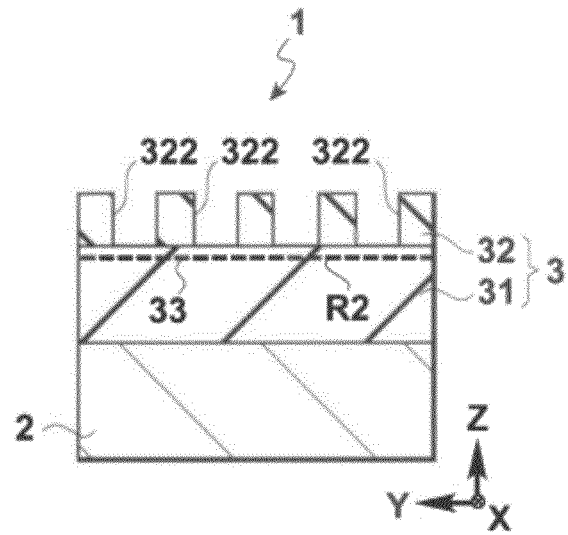
FIG. 7 is a main portion cross-sectional view schematically illustrating an HEMT of a semiconductor device according to Modification 2 of Embodiment 1.

The planer shape of each recess 322 of the semiconductor device 1 according to Modification 2 of Embodiment 1 is set the same as that of each recess 322 of the semiconductor device 1 according to Modification 1 of Embodiment 1. As illustrated in FIG. 7 (a cross-sectional view taken along a line F7-F7 illustrated in FIG. 5), the cross-sectional shape of each recess 322 is a little different from that of the semiconductor device 1 according to Modification 1 and has a rectangular shape dug from the surface of the second semiconductor layer 32 to reach the heterojunction interface (the interface between the first semiconductor layer 31 and the second semiconductor layer 32), to reach the two-dimensional carrier gas layer 33 near the surface of the first semiconductor layer 31, or into the first semiconductor layer 31 across the two-dimensional carrier gas layer 33. In short, the recesses 322 according to Modification 2 are set deeper than the recesses 322 according to Modification 1.

In the regions where the recesses 322 are located, the second semiconductor layer 32 does not exist. The two-dimensional carrier gas layer 33 is therefore not generated just under the recesses 322. Accordingly, the two-dimensional carrier gas layer 33 is shaped in stripes which are extended in the direction X in parallel to each other and are separated at regular intervals in the direction Y. The intervals are equal to the intervals of the recesses 322 in the direction Y. The channel resistance R2 can be easily set higher with the recesses 322 according to Modification 2 than that with the recesses 322 according to Modification 1, and the device area of the HEMT can be reduced more easily.

(Embodiment 2)

As for the semiconductor device 1 according to Embodiment 2, a description is given of another method of controlling the channel resistance R2 of the two-dimensional carrier gas layer 33 instead of controlling the recess 322 between the gate electrode (G1) 5 and auxiliary electrode (G2) 6 in the HEMT of the semiconductor device 1 according to Embodiment 1.

[Device Structure of Semiconductor Device]

Figure 8:
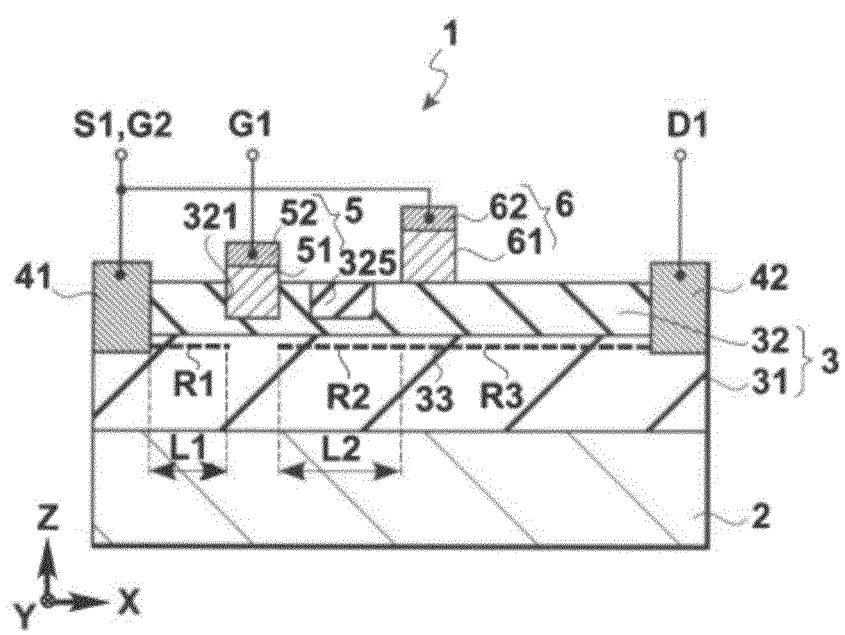
FIG. 8 is a main portion cross-sectional view schematically illustrating an HEMT of a semiconductor device according to Embodiment 2.

As illustrated in FIG. 8, the semiconductor device 1 according to Embodiment 2 includes a high-resistance generating layer 325 which is located within the second semiconductor layer 32 from the surface thereof between the gate electrode (G1) 5 and auxiliary electrode (G2) 6 of the HEMT.

The high-desistance generating layer 325 is formed by introducing ions with high electronegativity into the second semiconductor layer 32. The ions with high electronegativity generate fixed negative charges in the second semiconductor layer 32. The fixed negative charges extrude carriers (electrons herein) of the two-dimensional carrier gas layer 33 generated just under the high-resistance generating layer 325. In other words, the high-resistance generating layer 325 reduces the carrier density of the two-dimensional carrier gas layer 33 generated just under the same or prevents the generation of the two-dimensional carrier gas layer 33 to increase the channel resistance R2 (sheet resistance).

Similar to the recesses 322 of the semiconductor device 1 according to Modification 2 of Embodiment 1, the high-resistance generating layer 325 may be configured to reach the heterojunction interface, to reach the two-dimensional carrier gas layer 33 in the first semiconductor layer 31, or to be extended across the two-dimensional carrier gas layer 33 in the first semiconductor layer 31.

The high-resistance generating layer 325 can be formed by practically using fluorine (F) ions, iron (Fe) ions, or the like, which are high in electronegativity.

[Manufacturing Method of Semiconductor Device]

Next, as for the semiconductor device 1 according to Embodiment 2, the method of manufacturing the characteristic high-resistance generating layer 325 is described below. The entire manufacturing method thereof is not described.

On the surface of the second semiconductor layer 32 of the semiconductor functioning layer 3, a mask 7 is formed. The mask 7 has an opening in a region where the high-resistance generating layer 325 is to be formed (see FIG. 9). The mask 7 is a resist mask formed by photolithography, for example.

Figure 9:
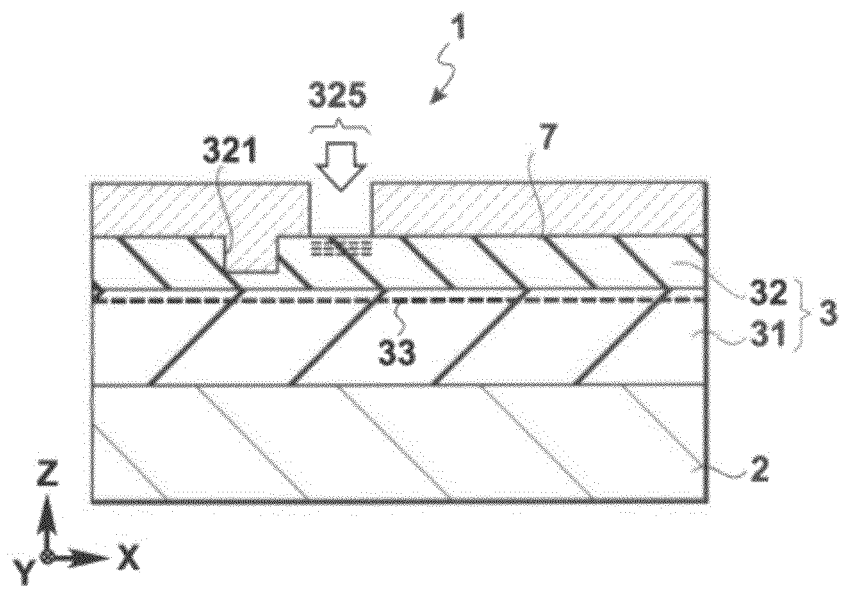
FIG. 9 is a cross-sectional process view illustrating a method of manufacturing the HEMT of the semiconductor device according to Embodiment 2.

As illustrated in FIG. 9, ions with high electronegativity are introduced into the second semiconductor layer 32 through the opening of the mask 7 to form the high-resistance generating layer 325. The introduced ions are fluorine ions, for example. Fluorine ions are introduced by a plasma immersion ion implantation (PII) technique, for example. The PII technique is performed using $CF_4$ gas at a high-frequency power set to 150 W for 150 sec, for example.

After the high-resistance generating layer 325 is formed, the mask 7 is removed.

[Characteristics of Semiconductor Device]

As described above, in the semiconductor device 1 according to Embodiment 2, the HEMT includes the auxiliary electrode (G2) 6, and the channel resistance R2 of the two-dimensional carrier gas layer 33 can be set higher between the gate electrode (G1) 5 and the auxiliary electrode 6. Similar to the semiconductor 1 according to Embodiment 1, it is possible to prevent the HEMT from being damaged, broken, or burned by excess current due to external noise or the like.

(Embodiment 3)

As for the semiconductor device 1 according to Embodiment 3, a description is given of an example which is the same as the semiconductor device 1 according to Embodiment 1 except the structure of the auxiliary electrode (G2) 6 of the HEMT.

[Device Structure of Semiconductor Device]

Figure 10:
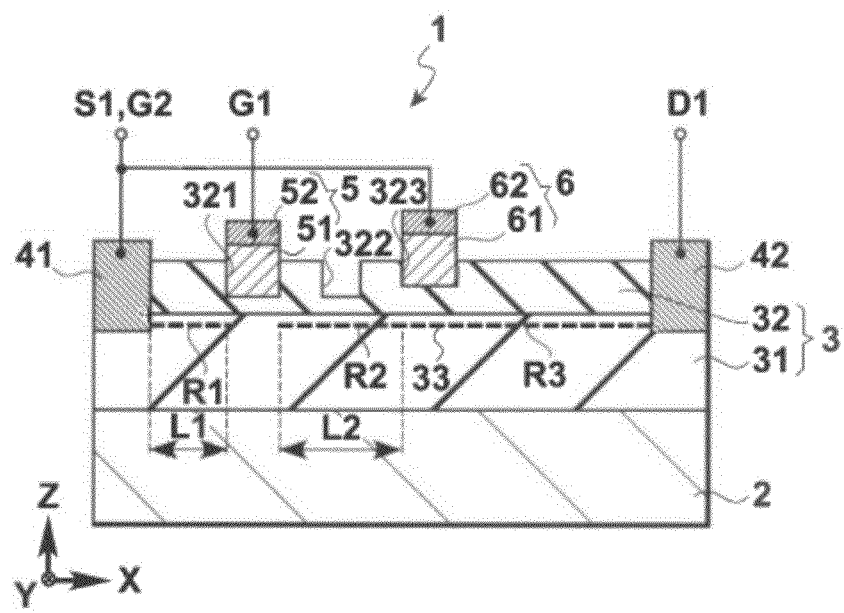
FIG. 10 is a main portion cross-sectional view schematically illustrating a structure of a HEMT of a semiconductor device according to Embodiment 3.

As illustrated in FIG. 10, the semiconductor device 1 according to Embodiment 3 includes a recess 323 dug into the second semiconductor layer 32 from the surface thereof under the auxiliary electrode (G2) 6 of the HEMT. The auxiliary electrode 6 is located on the bottom surface of the recess 323 in the recess 323.

The recess 323 is shallower than the recess 321 located under the gate electrode 5 so that the part including the auxiliary electrode 6 has a normally on characteristic. The depth of the recess 323 may be equal to that of the recess 321 (or recess 322) if the electrode material of the auxiliary electrode 6 is adequately adjusted.

By providing the recess 323 just under the auxiliary electrode 6, the second semiconductor layer 32 is made thin just under the auxiliary electrode 6. This can reduce the supply of carriers forming the two-dimensional carrier gas layer 33 from the second semiconductor layer 32. In other words, the threshold voltage of the part including the auxiliary electrode 6 can be adjusted.

The semiconductor device 1 according to Embodiment 3 can provide a similar effect to the effect provided by the semiconductor device 1 according to Embodiment 1. The semiconductor device 1 according to Embodiment 3 can be combined with the semiconductor device 1 according to Embodiment 2.

(Other Embodiments)

The present invention is described above with the plurality of embodiments, but the description and drawings constituting a part of the disclosure will not limit the present invention. The present invention can be applied to various substitutions, examples, and operational techniques.

For example, the auxiliary electrode (G2) 6 of the semiconductor device 1 is made of a Schottky electrode material. However, the auxiliary electrode 6 may have a MIS (metal insulator semiconductor) structure. Moreover, the auxiliary electrode 6 may be connected to a fixed potential different from the source electrode 41 instead of being electrically connected to the source electrode 41.

What is claimed is:

1. A semiconductor device, comprising:
a first semiconductor layer;
a second semiconductor layer provided on the first semiconductor layer with a heterojunction interface interposed therebetween;
a two-dimensional carrier gas layer provided near the heterojunction interface in the first semiconductor layer;
a source electrode electrically connected to one end of the two-dimensional carrier gas layer;
a drain electrode electrically connected to the other end of the two-dimensional carrier gas layer;

a gate electrode provided above the two-dimensional carrier gas layer between the source electrode and the drain electrode; and an auxiliary electrode provided above the two-dimensional carrier gas layer between the gate electrode and the drain electrode; and a first recess in the semiconductor layer spanning from the surface of the second semiconductor layer toward the heterojunction interface between the gate electrode and the auxiliary electrode forming a channel resistance of the two-dimensional carrier gas layer between the gate electrode and the auxiliary electrode that is higher relative to a channel resistance of the two-dimensional carrier gas layer between the gate electrode and the source electrode.

2. The semiconductor device of claim 1, wherein
the auxiliary electrode is supplied with a fixed potential, and
the auxiliary electrode has a normally on structure in which a channel is generated in the two-dimensional carrier gas layer just under the auxiliary electrode.

3. The semiconductor device of claim 1, wherein
the auxiliary electrode is electrically connected to the source electrode.

4. The semiconductor device of claim 1, wherein
channel length of the two-dimensional carrier gas layer between the gate electrode and the auxiliary electrode is longer than channel length of the two-dimensional carrier gas layer between the gate electrode and the source electrode.

5. The semiconductor device of claim 1, wherein
sheet resistance of the two-dimensional carrier gas layer between the gate electrode and the auxiliary electrode is set higher than that between the gate electrode and the source electrode.

6. The semiconductor device of claim 1, further comprising
a second recess dug in the semiconductor layer from the surface of the semiconductor layer toward the heterojunction interface between the first recess and the drain electrode, wherein
the auxiliary electrode is provided in the second recess.

* * * * *